US007979273B2

(12) United States Patent
Haupt et al.

(10) Patent No.: US 7,979,273 B2
(45) Date of Patent: Jul. 12, 2011

(54) METHOD AND APPARATUS FOR THE DIGITIZATION OF AND FOR THE DATA COMPRESSION OF ANALOG SIGNALS

(75) Inventors: Axel Haupt, Langenhagen (DE); Volker Schmitt, Hannover (DE); Johannes Huber, Langensendelbach (DE); Bernd Matschkal, Zirndorf (DE)

(73) Assignees: Sennheiser electronic GmbH & Co. KG, Wedemark (DE); Friedrich-Alexander-Universitaet Erlangen-Nuernberg, Erlangen (DE)

( * ) Notice: Subject to any disclaimer, the term of this patent is extended or adjusted under 35 U.S.C. 154(b) by 1095 days.

(21) Appl. No.: 10/565,838

(22) PCT Filed: Jul. 23, 2004

(86) PCT No.: PCT/EP2004/008217
§ 371 (c)(1),
(2), (4) Date: Feb. 12, 2007

(87) PCT Pub. No.: WO2005/013492
PCT Pub. Date: Feb. 10, 2005

(65) Prior Publication Data
US 2007/0211804 A1 Sep. 13, 2007

(30) Foreign Application Priority Data

Jul. 25, 2003 (DE) .................................. 103 34 357

(51) Int. Cl.
*G10L 21/00* (2006.01)

(52) U.S. Cl. ........................... 704/222; 704/212; 375/22
(58) Field of Classification Search .................. 704/212, 704/222; 375/22
See application file for complete search history.

(56) References Cited

U.S. PATENT DOCUMENTS

| 4,433,604 | A |   | 2/1984 | Ott |
| 6,028,634 | A | * | 2/2000 | Yamaguchi et al. ...... 375/240.16 |
| 6,198,830 | B1 | * | 3/2001 | Holube et al. .................. 381/321 |
| 2002/0176353 | A1 | * | 11/2002 | Atlas et al. ..................... 370/203 |

FOREIGN PATENT DOCUMENTS

EP 0 360 770 3/1990

OTHER PUBLICATIONS

R. M. Gray, David L. Neuhoff, Quantization, *IEEE Transactions on Information Theory*, pp. 2325-2383, Oct. 1998.
T. Berger, Lossy Source Coding, *IEEE Transactions on Information Theory*, pp. 2693-2723, Oct. 1998.
L. Pakula and S. Kay, Simple Proofs of the Minimum Phase Property of the Prediction Error Filter, *IEEE Transactions on ASSP*, vol. 31, 1983.
Erik Agrell, Thomas Eriksson, Alexander Vardy, Kenneth Zeger, Closest Point Search in Lattices, *IEEE Transactions on Information Theory*, pp. 2201-2214, Aug. 2002.

(Continued)

*Primary Examiner* — Daniel D Abebe
(74) *Attorney, Agent, or Firm* — Frommer Lawrence & Haug LLP

(57) ABSTRACT

The invention is based on the idea of providing a method for high-resolution, waveform-preserving digitization of analog signals, wherein conventional scalar logarithmic quantization is transferred to multi-dimensional spherical coordinates, and the advantages resulting from this, e.g., a constant signal/noise ratio over an extremely high dynamic range with very low loss with respect to the rate-distortion theory. In order to make use of the statistical dependencies present in the source signal for an additional gain in the signal/noise ratio, the differential pulse code modulation (DPCM) is combined with spherical logarithmic quantization. The resulting method achieves an effective data reduction with a high long-term and short-term signal/noise ratio with an extremely small signal delay.

19 Claims, 4 Drawing Sheets

OTHER PUBLICATIONS

XP-009038121 / Huber, et al "Spherical logarithmic quantization and its application for DPCM" ITG-Fachbericht, VDE-Verlag GmbH, Jan. 2004 pp. 349-356.

XP-002301076 / Adoul, et al. :Baseband speech coding at 2400 BPS using spherical vector quantization Proceedings of the *IEEE* International Conference on Acoustics, Spweech and Signal Processing *IEEE*, NY, Mar. 1984, pp. 1.12.1-1.12.4.

XP-002301078 / Swaszek "Uniform spherical coordinate quantization of spherically symmetric sources" *IEEE* Transactions on Communications USA, Jun.1985, pp. 518-521.

\* cited by examiner

METHOD AND APPARATUS FOR THE DIGITIZATION OF AND FOR THE DATA COMPRESSION OF ANALOG SIGNALS

CROSS-REFERENCE TO RELATED APPLICATIONS

This application claims priority of International Application No. PCT/EP2004/008217, filed Jul. 23, 2004 and German Application No. 103 34 357.1, filed Jul. 25, 2003, the complete disclosures of which are hereby incorporated by reference.

BACKGROUND OF THE INVENTION a) Field of the Invention

The present invention is directed to a method and apparatus for the digitization of analog signals and a method and apparatus for data compression of analog signals.

b) Description of the Related Art

In many fields of digital information transmission there exists the common goal of transporting an initially analog source signal (measuring, studio-quality audio signal processing, and so on) to a receiver while making use of the advantages of digital transmission in order to reproduce this analog source signal in the receiver in the form of an analog output signal. For this purpose, the analog signal must be digitized and quantized on the one hand and a corresponding data compression must be carried out on the other hand in order to transmit the signal with the highest possible quality via a digital transmission system with a limited rate. After a PCM encoding, methods for data compression are usually applied which make use of the redundancy within the source signal and irrelevance with respect to specific characteristics of the consumer of the signal. The numerous existing methods for digitizing analog source signals use approaches that sometimes differ fundamentally, but all of them can be divided into two main categories:

i) Methods in which the reconstructed waveform very closely approximates the original waveform, i.e., there is no use of irrelevance. The term "waveform-preserving" is used here in place of the often applied term "lossless" with respect to the waveform coding because the digitization of an analog signal at a limited data rate is, on principle, not "lossless" (i.e., infinite entropy of a continuous random variable).

ii) Non-waveform-preserving methods. These methods are of crucial importance, for example, in the audio field, where often only the subjective aural impression at the receiver output is decisive (e.g., use of psychoacoustic masking effects). In this case, waveform changes (amplitude distortion and phase distortion) undergone by the signal through quantization and compression generally only play a subordinate role. Normally, a signal processing using irrelevance leads to a reconstructed waveform that differs greatly from the original waveform and, moreover, is often afflicted by extensive signal delay (e.g., because of spectral transformations or equivalent block-based methods). The transmission quality in a method of the type mentioned above cannot be measured by a $10 \log_{10}$ signal/noise ratio (SNR) in the conventional way; rather, it must be determined by time-consuming listening tests by trained personnel. However, signal coding methods of this type are totally unusable for many areas of application (e.g., metrology, recording of waveforms for further signal processing at a later time, real-time signal transmission using digital modulation methods that do not permit significant signal delay, e.g., for wireless digital stage microphones).

OBJECT AND SUMMARY OF THE INVENTION

Therefore, it is the primary object of the present invention to provide a method and apparatus for the digitization and compression of analog signals with improved quality.

This object is met by a method for the digitization of analog signals comprising the steps of digitizing analog source signals, transforming the digitized source signals from the time domain to the spherical domain, wherein the transformation is a D-dimensional transformation with D>2 and logarithmic quantizing of the radius in the spherical domain. It is also met by an apparatus for the digitization of analog signals comprising means for the digitization of analog source signals, means for the transformation of the digitized source signals from the time domain to the spherical domain, wherein the transformation is a D-dimensional transformation with D>2, and means for the logarithmic quantization of the radius in the spherical domain. It is further met by a method for the compression of analog signals comprising the steps of digitizing analog source signals by the method described above and carrying out a differential pulse code modulation. It is also met by an apparatus for the compression of analog signals comprising the apparatus described above including an encoder for differential pulse code modulation and a forward prediction device for determining a starting value for the samples of the quantization based on the current state of a prediction filter, a reconstruction device for reconstructing the subsequent D samples, a D-dimensional logarithmic spherical quantization device for quantizing the values obtained by the forward prediction in order to determine a starting cell, wherein the prediction of the differential pulse code modulation is run through iteratively in order to determine a quantization cell with the smallest quantization error.

Accordingly, a method is provided for the digitization of analog source signals in which a D-dimensional spherical logarithmic quantization of the analog source signals is carried out.

According to one aspect of the present invention, a method and an apparatus are likewise provided for the compression of analog source signals in which a digitization of analog source signals is carried out in accordance with the method described above, and wherein a differential pulse code modulation is carried out.

Accordingly, a waveform-preserving method is provided which meets the following requirements: a) low data rate through the use of favorable packing characteristics of multi-dimensional lattices (vector quantization) and through the use of dependencies in the sequence of samples from the source signal; b) extremely high dynamic range, i.e., the SNR is constant over a very large modulation range of, e.g., 60 dB or more with respect to the short-term variance of an analog source signal; c) high objectively measurable signal/noise ratio by segments for short segments of samples, preferably within the meaning of the ratio of variance of the useful signal to the mean square error; d) insensitivity to specific signal parameters such as probability density function by segment, etc.; and, most importantly, e) introduction of an extremely small signal delay on the order of a few (up to ten) sampling periods.

The invention is based on the idea of providing a method for high-resolution, waveform-preserving digitization of analog signals, wherein conventional scalar logarithmic quantization is transferred to multi-dimensional spherical coordinates, and the advantages resulting from this, e.g., a constant signal/noise ratio over an extremely high dynamic range with very low loss with respect to the rate-distortion theory. In order to make use of the statistical dependencies present in the source signal for an additional gain in the signal/noise ratio, the differential pulse code modulation (DPCM) is combined with spherical logarithmic quantization. The resulting method achieves an effective data reduction with a high long-term and short-term signal/noise ratio with an extremely small signal delay.

Further embodiments of the invention are indicated in the subclaims.

In the following, the invention will be described more fully with reference to the accompanying drawings.

DESCRIPTION OF THE PREFERRED EMBODIMENTS

Figure 1:
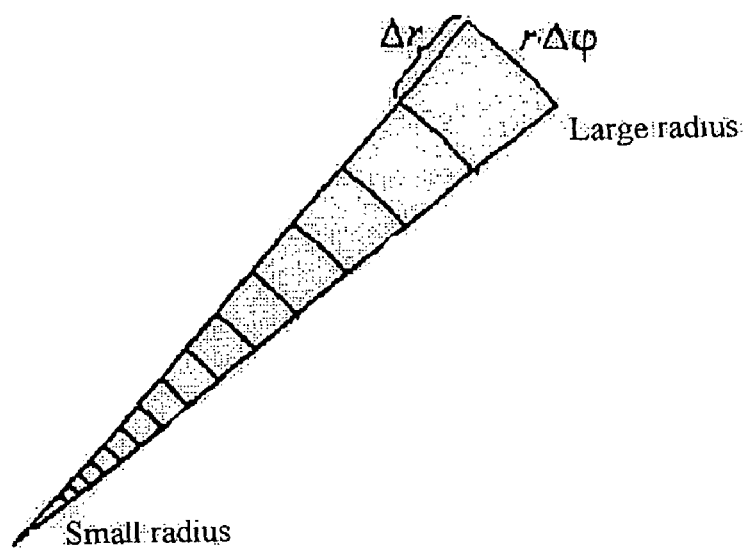
FIG. 1 shows the proportionality of an arc segment to the radius.

The aim of the logarithmic quantization is a high dynamic of the quantizer, that is, a wide range of the average signal level in which the SNR and, therefore, the maximum relative quantization error $$\frac{\Delta_{q_i}/2}{r_i}$$

is constant, wherein $\Delta q_i$ is the width of the ith quantization interval and $r_i$ is the respective reconstruction value. This aim leads to logarithmic quantization, e.g., within the meaning of the A-law according to K. Tröndle, R. Weiβ, Introduction to Pulse Code Modulation, Oldenbourg Verlag, Munich, 1974. For the range of average modulation, the following signal/noise ratio is given for R>>1 according to N. S. Jayant, P. Noll, Digital Coding of Waveforms, Prentice-Hall, Englewood Cliffs, N.J., 1984:

$$10\log_{10}(SNR) = R \cdot 6.02 \text{ dB} + 10\log_{10}\frac{3}{(1+\ln(A))^2}, \quad (1)$$

where R is the average rate of quantization (bits/sample) and A represents the usual parameters of logarithmic quantization; that is, the maximum relative error is constant for samples with an amount greater than 1/A (with reference to a signal range of the quantization of −1 to +1). Therefore, a signal/noise ratio according to (1) is achieved after an average signal level of the source signal of $$-B_1 := 20 \log_{10}(1/A) \text{ dB}. \quad (2)$$

Accordingly, the value $B_1$ characterizes the dynamic range of the logarithmic quantization. Also, the signal/noise ratio is entirely independent from the probability density function (PDF) of the source signal within this dynamic range so that the method can be used universally. However, in comparison with a uniform quantization at full drive by an equidistributed signal, the term $10 \log_{10}(3/(1+\ln(A))^2)$ to a certain extent represents a signal/noise ratio loss by companding, which is the price of a large dynamic range.

A quantization in spherical coordinates in D dimensions will be described in the following.

Spherical logarithmic quantization belongs to the family of vector quantization methods (e.g., R. M. Gray, David L. Neuhoff, Quantization, *IEEE Transactions on Information Theory*, pp. 2325-2383, October 1998, Manfred Herbert, Lattice Quantization of Speech Signals and Speech Model Signals. Selected Works on Information Systems, No. 79, editor: H.-W. Schüβler, Erlangen 1991). By means of dense spherical packing in many dimensions, considerable gains in signal/noise ratios can be achieved in the quantization even when no statistical dependencies within the signals can be made use of. In spherical quantization, a vector $x:=(x_1, \ldots, x_D)$ with D samples in Cartesian coordinates is expressed in polar coordinates $u:=(\phi_1, \ldots, \phi_{D-1}, r)$. The D−1 angle $\phi_1$ and the radius r are given by the following equations (where j is an imaginary unit and arg (·) is an argument function which indicates the angle of a complex number in radian measure):

$$\varphi_1 = \arg(x_1 + jx_2) \in [-\pi, +\pi) \quad (3)$$

$$\varphi_1 = \arg\left(\sqrt{\sum_{l=1}^{i} x_l^2} + jx_{i+1}\right) \in \left[-\frac{\pi}{2}, \frac{\pi}{2}\right], i \in \{2, \ldots, D-1\}. \quad (4)$$

$$r^2 = \sum_{l=1}^{D} x_l^2 \quad (5)$$

The reconstruction of the Cartesian components from vector u is carried out from this according to $$x_i = r \cdot b_{i-1} \cdot \sin(\phi_{i-1}), i \in \{D, \ldots, 2\} \quad (6)$$

$$x_1 = r \cdot b_1 \cdot \cos(\phi_1) = r \cdot b_0, \quad (7)$$

with the radii $b_i$ of the "parallel of latitude" of the unit sphere (radius 1):

$$b_{D-1} = 1, \quad (8)$$

$$b_i = 1 \cdot \prod_{l=i+1}^{D-1} \cos(\varphi_l), i \in \{D-2, \ldots, 0\} \quad (9)$$

Accordingly, an economical recursive representation is found proceeding from $\phi_{D-1}$. An efficient implementation of forward transformation and backward transformation is made possible with little complexity by means of the so-called CORDIC algorithm (described in Volder, Jack, The CORDIC Trigonometric Technique, *IRE Trans. Electronic Computing*, Vol. EC-8, pp. 330-334, September 1959).

Spherical logarithmic quantization is described in the following.

In order to continue to make use of the advantages of logarithmic quantization, i.e., the independence of the SNR from the PDF of the source signal, with quantization in polar coordinates, the amount (radius) is quantized logarithmically according to the rules of the A-law. The angles $\phi_i$ are uniformly quantized individually, in each instance with the quantization intervals being selected in each instance depending on the higher-order angles $\hat{\phi}_l$, $l \in \{i+1, l+2, \ldots, D-1\}$ that have already been quantized and which are also used for the reconstruction. In this way, a very simple implementation of the quantization and the signal reconstruction is achieved and a stepwise processing of the individual coordinates, as in scalar quantization, is preserved by the iterative procedure according to (3) to (9).

Due to the proportionality of the length of an arc segment to the radius, the requirements for the logarithmic quantization, i.e., the proportionality of the size of a quantization interval to the signal value, are already met for uniform quantization of the angles. FIG. 1 shows a simple example for two dimensions D=2. Therefore, the second term in (1) must be counted for only one of the total of D dimensions; herein lies the essential reason for the gains achieved by means of spherical logarithmic quantization.

In order to facilitate the implementation of quantization in spherical coordinates, we start from approximately cubic quantization cells, i.e., the surface of a D-dimensional sphere with radius 1 is quantized by a network of D−1 dimensional (hyper-)cubes. As will be shown in the following, however, this suboptimal quantization of the spherical surface compared to an optimally densely packed lattice results in a loss of only $$10 \log_{10}\left(\frac{\pi e}{6}\right) = 1.53 \text{ dB},$$

in the limit D→∞, that is, a rate loss of about 1/4 bit/sample, which is accepted for the sake of facilitated implementation.

The following description explains how the $M^D$ (i.e., $M := 2^R$) quantization stages available per quantization step are optimally divided into the individual quantization intervals for the radius and the surface of the D-dimensional unit (hyper-)sphere.

As is conventional, the applicable compressor characteristic for the logarithmic range $$\frac{r_0}{A} \leq r \leq r_0$$

of the A-law rule is $$k(r) = r_0 \cdot \left(c \cdot \ln \frac{r}{r_0} + 1\right), \text{ where } c := \frac{1}{1 + \ln A} \quad (10)$$

This is derived by $$k'(r) := \frac{dk(r)}{dr} = \frac{c \cdot r_0}{r}. \quad (11)$$

A refers to the free parameter of the A-law and $r_0$ is introduced as a normalization factor for the radius which will be described more fully in the following. With $M_D$ quantization intervals for the radius (Dth component of vector u), the width of the quantization cell in direction of the radius is given by:

$$\Delta r(r) \approx \frac{r_0}{M_D \cdot k'(r)} = \frac{1}{M_D \cdot c} \cdot r. \quad (12)$$

It will be noted that $\Delta r(r)$ is not dependent on $r_0$ in the domain in question.

In order that a saturation behavior similar to that in Cartesian coordinates can be obtained with quantization in polar coordinates, the maximum value $r_0$ for the radius is normalized in such a way that the D-dimensional sphere has the same volume as a D-dimensional cube with edge length 2 (corresponding to a quantization range $x_i \in [-1;1]$ in every dimension), i.e., $$V_{sphere} \stackrel{!}{=} V_{cube}: \alpha_D \cdot r_0^D \stackrel{!}{=} 2^D,$$

with the volume $\alpha_D$ of the D-dimensional unit sphere according to J. H. Conway and N. J. A. Sloane, Sphere Packings, Lattices, and Groups, Springer-Verlag, 3rd edition.

$$\alpha_D = \frac{\pi^{D/2}}{(D/2)!} \quad (13)$$

Therefore:

$$r_0 = \frac{2}{\alpha_D^{1/D}}, \text{ where } r_0 > 1 \; \forall \; D \in IN. \quad (14)$$

To facilitate the determination of the resulting signal/noise ratio, r=1 is used in the following, i.e., those quantization cells lying on the surface of a sphere with unit radius are considered. This is possible without limiting generality because the SNR is not dependent upon radius due to the logarithmic quantization in the domain:

$$\frac{r_0}{A} \leq r \leq r_0.$$

The width of the quantization cells is now given by:

$$\Delta := \frac{1}{M_D \cdot c}. \quad (15)$$

By means of the uniform angular quantization mentioned above, the surface of the D-dimensional unit sphere is divided into $M_\phi$ cells having in each instance the form of D−1-dimensional cubes. For the surface of this D−1-dimensional sphere, according to J. H. Conway and N. J. A. Sloane, Sphere Packings, Lattices, and Groups, Springer-Verlag, 3rd edition:

$$S = \beta_D \cdot r^{D-1}, \text{ where } \beta_D = D \cdot \alpha_D. \quad (16)$$

The division of the quantizing stages into radius and angle is described the following.

The following considerations must be taken into account for a fair division of the $M_D$ available quantization cells into radius and surface of the unit sphere: with respect to the approximation by cubic quantization cells, i.e., approximately equal dimensioning of the quantization cells in all dimensions (radius and arc segment), the surface of the unit sphere (r=1) must be divided into $M_\varphi$ equal (D−1)-dimensional cubes with identical edge length $\Delta$.

$$S = \beta_D \stackrel{!}{=} M_\varphi \cdot \Delta^{D-1}. \tag{17}$$

Since there are $M=2^R$ available intervals per sample, $$M_\varphi \cdot M_D \stackrel{!}{=} M^D \tag{18}$$

must be demanded in addition.

With (15), (17) and (18), the quantity of the quantization intervals available for the quantization of the radius is given by:

$$M_D := M \cdot \frac{1}{\beta_D^{1/D}} \frac{1}{c^{(D-1)/D}}. \tag{19}$$

Figure 2:
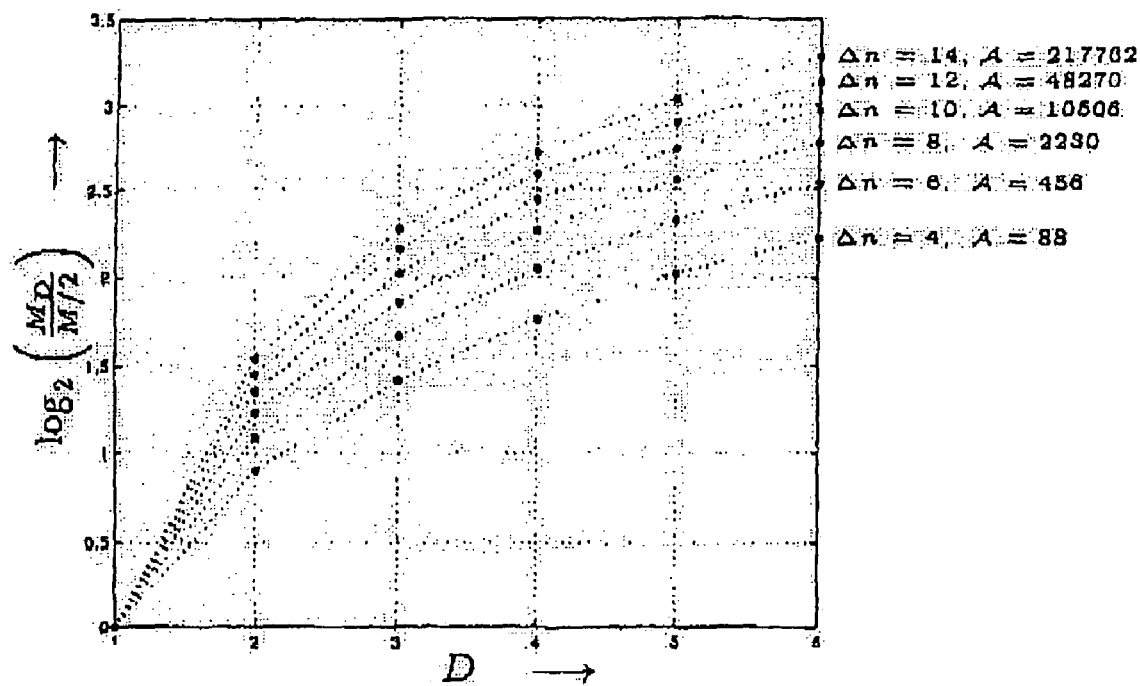
FIG. 2 is a graph illustrating the quantity of quantization cells associated with a radius, normalized to the cell quantity per absolute value of a sample in scalar quantization.

The quotients $M_D/(M/2)$ of the quantity of quantization cells dedicated to the radius are plotted in FIG. 2 normalized to the cell quantity per absolute value of a sample in scalar quantization (D=1) compared to the dimension number for a series of examples of parameter A of A-law companding. The values of A are selected in such a way that the use of A-law companding leads to very small quantization intervals which are smaller by a factor of $2^{\Delta n}$, $\Delta n \in \mathbb{N}$ than they would be with uniform quantization with an identical total interval number:

$$\Delta r(r \leq 1/A) = 2^{-\Delta n} \cdot \frac{1}{M_D}, \text{ i.e.,} \tag{20}$$

$$2^{\Delta n} = \frac{A}{1 + \ln A}. \tag{21}$$

Consequently, the resolution is increased by $\Delta n$ bits for small values of r.

FIG. 2 shows that spherical logarithmic quantization beyond a factor of 8 allocates more intervals to the radius than a scalar quantization with an equivalent resolution in the range of very small signal values. Therefore, a gain of 3 bits/sample or 18 dB for spherical logarithmic quantization is achieved in this range.

The edge length of the quantization cells on the surface of the unit sphere is obtained using (15):

$$\Delta = \frac{1}{M} \cdot \left(\frac{\beta_D}{c}\right)^{\frac{1}{D}}. \tag{22}$$

The constant c is determined by the selected dynamic range, see (2) and (10).

The actual uniform quantization of the angle variables for identical arc segments on the unit sphere is obtained by means of the recursive equations (8) and (9). $M_i$ intervals are available for the coordinate $\phi_i$:

$$M_{D-1} = \left\lfloor \frac{\pi}{\Delta} \right\rfloor \tag{23}$$

$$M_i(\hat{\varphi}_{i+1}, \dots, \hat{\varphi}_{D-1}) = \left\lfloor \frac{\pi \cdot \hat{b}_i}{\Delta} \right\rfloor \text{ for } \in \{D-2, D-3, \dots, 2\} \tag{24}$$

$$M_1(\hat{\varphi}_2, \dots, \hat{\varphi}_{D-1}) = \left\lfloor \frac{2\pi \cdot \hat{b}_1}{\Delta} \right\rfloor, \tag{25}$$

where $\lfloor x \rfloor \in \mathbb{N}$ is the greatest whole number $\leq x$ with $x \in \mathbb{R}^+$ and $\hat{b}_i$ corresponding to (8) and (9) for quantized angles $\hat{\varphi}_i$.

It should be noted that the quantity $M_i$ of quantization intervals in dimension i is a function of the quantization cell selected in dimensions $i+1, \dots, D-1$ and, therefore, can be calculated iteratively starting from $M_{D-1}$. It is not possible to calculate in advance.

The assignment of an index $N \in \{0, 1, \dots, M^D-1\}$ to the current quantization cell and the reconstruction can be carried out using linked lookup tables as is known from shell mapping, e.g., according to Robert F. H. Fischer, Precoding and Signal Shaping for Digital Transmission, pp. 258-281, John Wiley & Sons, Inc., New York, 2002, ISBN 0471 22410 3:

The assignment of an index to the radius is not dependent upon the cell index on the unit sphere so that the problem of index assignment for the surface of the unit sphere can now be considered.

The starting number of the index is 0, the maximum ending number of the index is $M_\varphi-1$ corresponding to the quantity of quantization cells on the surface of the unit sphere. $M_{D-1}$ is the quantity of subspheres of dimensionality D−1 and can be calculated from (23). A first-order lookup table with $M_{D-1}$ entries $N_0, \dots, N_{M_{D-1}-1}$ is used for the sake of fast implementation. In this connection, $N_i$ designates the smallest index of all cells belonging to the ith quantization interval for the angle $\hat{\phi}_{D-1}$:

$$N_0 = 0 \tag{26}$$

$$N_{i+1} = \sum_{v=0}^{i} M_{D-2}\left(\hat{\varphi}_{D-1} = v \cdot \frac{\pi}{\Delta}\right), i \in \{0, \dots, (M_{D-1}-2)\}$$

Accordingly, there are $N_{i+1}-N_i$ cells for a fixed ith value of $\hat{\phi}_{D-1}$. For every $N_i$, a second-order lookup table is applied which contains the indices $O_{ij}$ which again designate the smallest index of all of the cells of the jth quantization interval for the angle $\hat{\phi}_{D-2}$ within the D−1-dimensional subsphere to which $N_i$ refers.

$$O_{i,0} = 0 \tag{27}$$

$$O_{i,j+1} = \sum_{v=0}^{j} M_{D-3}\left(\hat{\varphi}_{D-2} = v \cdot \frac{\pi}{\Delta}, \hat{\varphi}_{D-1} = i \cdot \frac{\pi}{\Delta}\right),$$

$$i \in \{0, \dots, (M_{D-2}-1)\},$$

$$j \in \{0, \dots, \left(M_{D-2}\left(\hat{\varphi}_{D-1} = i \cdot \frac{\pi}{\Delta}\right) - 2\right)\}.$$

This procedure leads to D−2 orders of linked lookup tables in order to indicate the D−1 angles (the D−1-order lookup table for angle $\hat{\phi}_1$ would contain consecutive cell indices and must therefore not be tabularized).

The quantization noise and the signal/noise ratio are considered at greater length in the following.

As long as there is a sufficiently large quantity of quantization cells in D dimensions, the usual approximation of an equidistributed quantization error can be applied within these cubic cells, each cell being represented by its center. The output of the quantization noise is given approximately by:

$$\frac{\Delta^2}{12} \cdot D. \qquad (28)$$

The spherical logarithmic quantization forces $\Delta(r) = \Delta \cdot r$ in all dimensions for $$\frac{r_0}{A} \leq r \leq r_0.$$

Therefore, $$SNR = \frac{r^2}{\Delta^2 \cdot r^2 \cdot \frac{D}{12}} = F(D) \cdot M^2, \qquad (29)$$

$$\text{where } F(D) := \frac{12}{D} \cdot \left(\frac{c}{\beta_D}\right)^{\frac{2}{D}}, \qquad (30)$$

see also (22). As is wanted, the SNR is independent from the variance of the signal in this range.

Inserting (13) and (16) gives:

$$F(D) = \frac{12}{\pi} \cdot \frac{1}{D^{\frac{D+2}{D}}} \cdot ((D/2)!)^{2/D} \cdot c^{2/D}. \qquad (31)$$

Figure 3:
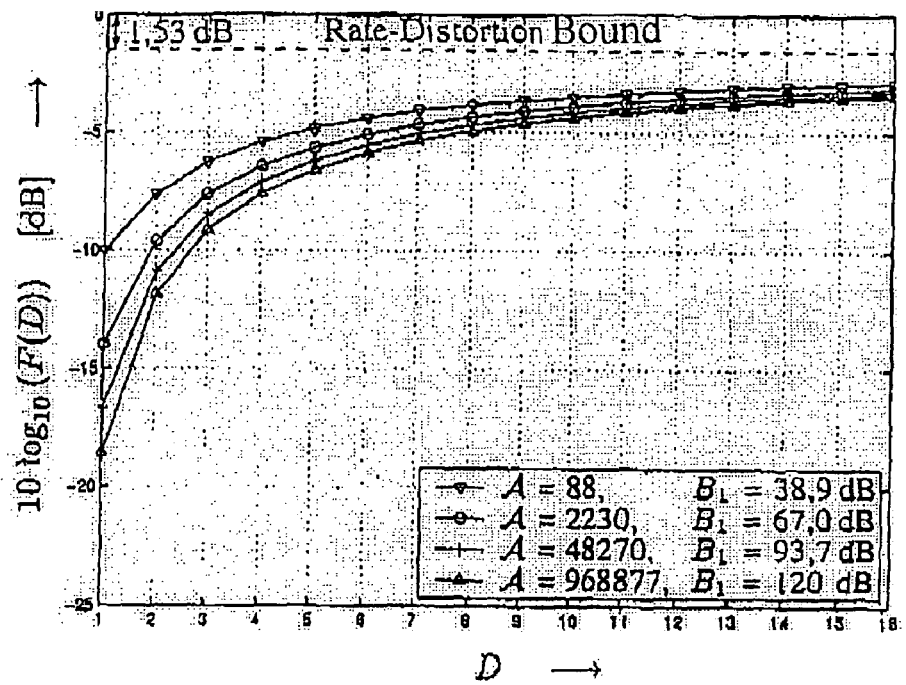
FIG. 3 is a graph illustrating a signal/noise ratio loss at different values of A.

When (29) is considered, F(D) can be interpreted as a loss with respect to the rate-distortion bound for iid Gaussian random variables (6 dB-per-bit rule). This relationship is shown in FIG. 3 for different values of A.

Stirling's approximation $$x! \approx \sqrt{2\pi x}\left(\frac{x}{e}\right)^x,$$

is used to calculate the limit $$\lim_{D \to \infty} F(D) = \frac{6}{\pi e} \hat{=} -1.53 \text{ dB} \qquad (32)$$

representing the loss in relation to the rate-distortion bound which is caused by the suboptimal cubic quantization cells (relative to (D−1)-dimensional hyperspheres for the quantization of the surface of a D-dimensional unit sphere and D→∞). In other words, spherical logarithmic quantization makes it possible to compensate again for the loss described in (1) resulting from companding to only 1.53 dB. Therefore, through the selection of the parameter A and D, it is possible in theory to achieve a dynamic range of any size (range of constant signal/noise ratio over the average signal level) without having to accept significant losses in the maximum signal/noise ratio that can be achieved. The asymptotic SNR loss of 1.53 dB corresponds to a rate loss of 1/4 bit/sample which is acceptable for the sake of an extreme reduction in complexity.

In view of the fact that no knowledge of a probability density function for iid source signal values can be deliberately assumed for the purpose of logarithmic companding, the rate-distortion function for the Gaussian random variables again gives the lower bound for the achievable rate (or distortion) at a given distortion (or rate) (Berger's upper bound of the rate-distortion function according to T. Berger, Lossy Source Coding, *IEEE Transactions on Information Theory*, pp. 2693-2723, October 1998). Therefore, improvements going beyond 1.53 dB or 1/4 bit/sample are not possible anyway under the present requirements and restrictions.

Figure 4:
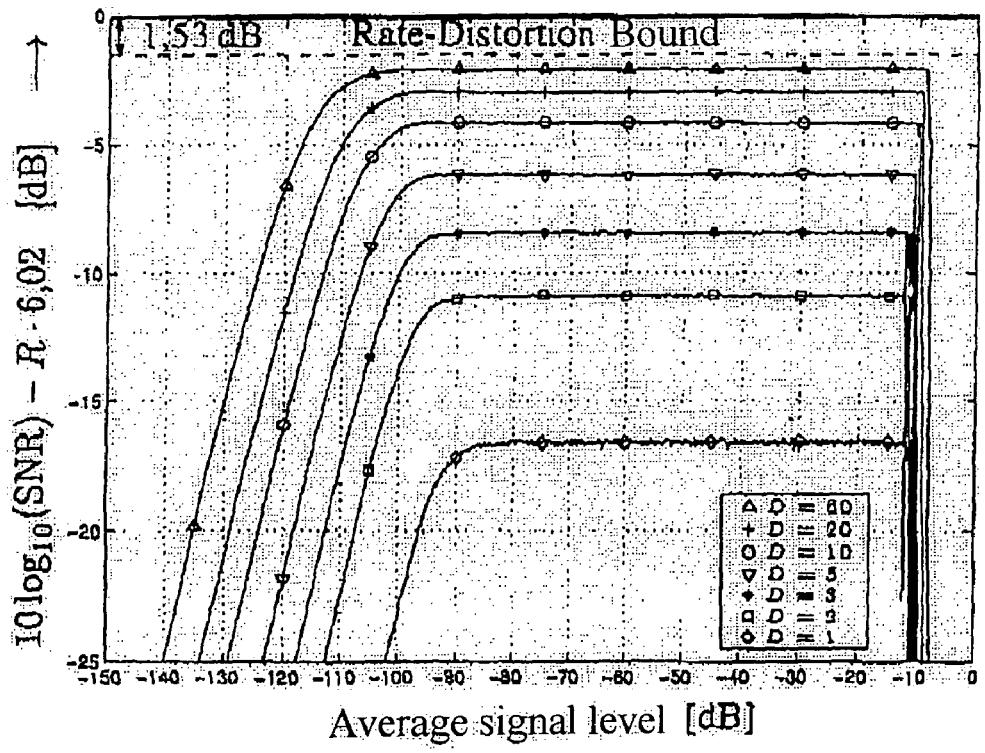
FIG. 4 is a graph illustrating the signal/noise ratio according to the present invention.

FIG. 4 shows, by way of example, the distance of the signal/noise ratio from the rate-distortion bound R·6 dB depending in the average signal level (10 log 10 (variance)) of iid random variables in Gaussian distribution when A=48270 for different dimension numbers of spherical logarithmic quantization. These simulation results exactly satisfy the theoretical analysis according to FIG. 3. At first glance, the very large values for A that are used in the examples in FIGS. 3 and 4 and in the following examples seem unrealistic and impossible to implement. However, it should be taken into account that substantially more than M intervals are usually used by means of (19) for the quantization of the radius ($M_D > M/2$) (see FIG. 2). Accordingly, even for very low rates, e.g., R=4 bits/sample, there are very fine quantization intervals for the radius. Further, (10) is an invertible function for every value of A>1 and is therefore very well suited in every case for specifying a determined non-uniform quantizer. This approach for proper waveform coding with extremely low signal delay should preferably not be used for rates below 3 bits/sample.

Further, it is clear from FIG. 4 that the dynamic range rises sharply through two effects as the dimension number increases with a constant parameter A. For one, the normalization radius $r_0$ increases; for another, the limiting of the logarithmic compression acts on only one dimension, the radius, whereas for D−1 dimensions the proportionality of the expansion of the quantization cell to the signal value (=arc length to radius with fixed angle difference) is also retained for very small signal values. Therefore, the dynamic range in D dimensions expands approximately to $$B_D \approx B_1 + 20 \log_{10}(r_0) + 10 \log_{10}(D). \qquad (33)$$

In addition, because of the averaging effect within D values, the saturation strength increases so that a further increase in the dynamic range is achieved. There is an infinitely large dynamic range for each desired value of A in limit (D→∞).

As in every vector quantization method, the delay of spherical logarithmic quantization by nature of its structure is equal to exactly D samples. As can be seen from FIGS. 3 and 4, the majority of the possible gains is already achieved at very small values of D (up to 5).

The combination of a spherical quantization and DPCM is described in the following.

Figure 5:
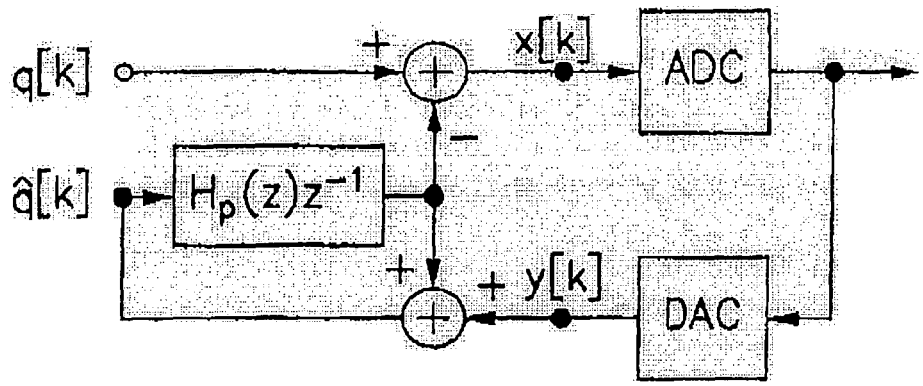
FIG. 5 shows a block diagram of a DPCM encoder with backward prediction according to the present invention.
Figure 7:
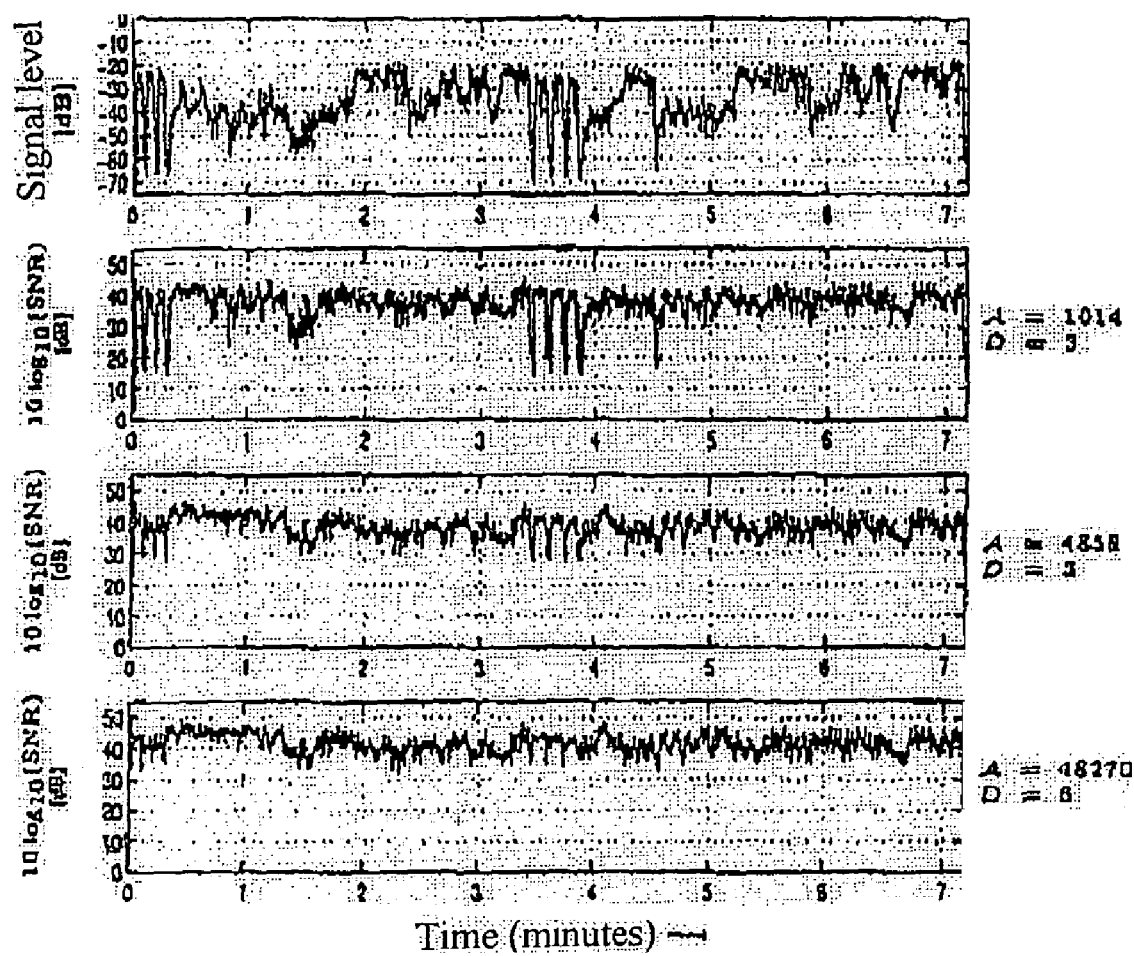
FIG. 7 shows graphs of the signal level and of the signal/noise ratio according to another embodiment example of the invention.

Correlations between the samples q[k] are made use of efficiently by means of differential PCM (DPCM) (see FIG. 5). A prediction error signal x[k] is generated by subtracting predicted samples that are obtained by means of a linear predictor filter $H_p(Z) \cdot z^{-1}$ from reconstructed samples q̂[k]. For an ideal predictor, the prediction error sequence x[k] shows a white power density spectrum (PSD) and minimal variance. This predictor filter is usually adaptive in order to adapt to a nonstationary source. With the aim of describing the interaction with spherical logarithmic quantization as simply as possible, only examples for a fixed predictor filter will be presented in the present case. In audio signals, for example, even very short, fixed prediction error filters (designed with respect to a compromise criterion) usually offer gains of more than 18 dB with a sample frequency of 44.1 kHz. Even segmentwise gains averaged over 6000 samples (0.136 s) of less than 15 dB can be observed only very rarely (see FIG. 7 compared to FIG. 3). Further, the gains are limited by adaptive prediction in case the signal delay is limited to a few samples and noticeable effects which are produced by updating the coefficients must be prevented. Of course, the following material can be generalized so as to apply directly to adaptive prediction.

It should be noted that a gain in SNR expressed by a reduction in the mean square error between the original samples and the reconstructed samples is possible when using the so-called backward prediction shown in FIG. 5.

With logarithmic quantization, the SNR of the prediction error signal x[k] is not dependent on its variance or, to express this differently, the output of the quantization noise is proportional to the signal output. Accordingly, the prediction gain, i.e., the quotient of the variances of q[k] and x[k] can be converted directly to a gain in SNR. Therefore, logarithmic quantization is a good choice for DPCM. In addition to this, no further signal delay inherent to the system is carried out by DPCM compared with PCM because an optimal prediction error filter for maximum prediction gain is fundamentally causal and strictly minimum phase (see L. Pakula and S. Kay, Simple Proofs of the Minimum Phase Property of the Prediction Error Filter, *IEEE Transactions on ASSP, Vol.* 31, 1983) and can therefore be inverted without structure-induced delay.

The gradient descent method will be described more fully in the following.

Application of spherical logarithmic quantization to DPCM with backward prediction is subject to the same set of problems as any other vector quantization method: in order to calculate the current prediction error signal x[k], all of the preceding reconstructed samples q[k−i], i=1, 2, . . . must be present. For a high prediction gain, the immediately preceding values (i=1, i=2) in particular are indispensable. Unfortunately, this requirement cannot be reconciled with the quantization of blocks of length D samples.

Any of the methods mentioned in the literature for combining vector quantization with DPCM can be used to solve this problem. In the present case, a method relying on the principle of analysis by synthesis is used. This method is known, for example from CELP waveform coding methods according to N. S. Jayant, P. Noll, Digital Coding of Waveforms, Prentice-Hall, Englewood Cliffs, N.J., 1984, and this approach is combined with a discrete gradient descent method.

In order to resolve the conflict between DPCM and vector quantization, the square Euclidean distance between vectors of samples $$q[l]=(q[l \cdot D], q[l \cdot D+1], \ldots, q[l \cdot D+D-1]) \quad (34)$$

and a corresponding reconstruction vector $\hat{q}[l]$ is minimized $l = \lfloor k/D \rfloor$.

It should be noted at this point that, in addition to spherical logarithmic quantization, the calculation of the corresponding prediction error signal and the inversion of the prediction error filter must be included in the calculation of a pair $q, \hat{q}$, wherein preceding reconstruction vectors $\hat{q}[l-m], m=1,2,\ldots$ are resorted to, but themselves remain unchanged. The aim of the algorithm is to find those quantization cells for x[l] for which the metric $$d^2(q, \hat{q}) = \sum_{i=0}^{D-1} (q[D \cdot l + i] - \hat{q}[D \cdot l + i])^2 \quad (35)$$

is minimized.

In order to find a suitable starting value for the algorithm, we suggest beginning with a forward prediction for the current D samples corresponding to a deactivation of the chain from ADC and DAC in FIG. 5, or inputting q[k], k=l·D, l·D+1, . . . , l·D+D−1 directly into the predictor filter (in FIG. 5) instead of $\hat{q}[k]$. Spherical logarithmic quantization is now carried out on the resulting vector x and a starting vector y is generated which in turn gives a vector $\hat{q}$ by conventional inversion of the prediction error filter (DPCM receiver structure). In this way, the metric calculation for a given quantized vector $y_i$ can be carried out. Starting from an actual reconstruction vector $y_i$, the reconstruction vectors of all 2D nearest neighbors $Y_{j[i]}$ in D dimensions are determined and the associated metrics are calculated with (35) and compared to one another. The vector with the smallest metric is used for the next iteration, i.e., $\arg \min_j d^2(q, \hat{q}_{j[i]})$ generates an updating of i, wherein $\hat{q}_i$ corresponds to the quantized vector $y_i$ and is calculated by inverting the prediction error filter. If no such vector exists, the algorithm is terminated and gives the index of the vector $y_i$ to be transferred. It should be noted here that the neighbor cells usually have very different indices and it is not a trivial matter to identify these cells. When we consider D=3, for example, the angles of the azimuth ($\phi_1$) are quantized more crudely at large elevations ($\phi_2$ near $\pm\pi/2$) than at small elevations ($\phi_2$ near 0) because the latter have a greater parallel of latitude on the sphere surface. For fast implementation, the indices of the neighbor cells could be stored in a ROM for all cells provided $M_\phi$ is not too large.

Since linear prediction is included in the optimizing process, the resulting SNR is often greater than can be predicted by adding the gains (in dB) from spherical logarithmic quantization and prediction (DPCM). Noteworthy gains in SNR can be observed particularly in case of small rates (e.g., R<5 bits/sample), which will be described in the following and with reference to FIG. 6. The Author is not currently aware of an analytic result for the SNR that can be achieved through this algorithm.

Simulations show that the required number of iterations is on average approximately 0.25 (per D sample) and, when limited to a maximum of 3 iterations, no significant losses are observed compared to an unlimited search space, so that the search for the optimal quantization cell for low dimension numbers can certainly be implemented in real time. Further, small values of D already yield large gains (see FIGS. 3 and 6).

On the reception side, there is no change compared with conventional DPCM methods. It should be noted here that the total delay of the transmission system is only D samples and it is excellently suited to transmissions which must meet the requirements of an extremely short delay.

Variants of the method are described more fully in the following.

To speed up the search for the most favorable quantization leading to minimum distortion, e.g., according to (35), all algorithms of the lattice decoding are applicable in principle or for finding a maximum likelihood codeword in channel coding (see, for example, Erik Agrell, Thomas Eriksson, Alexander Vardy, Kenneth Zeger, Closest Point Search in Lattices, *IEEE Transactions on Information Theory*, pp.

2201-2214, August 2002, and the references cited therein). This method is preferably transformed into spherical coordinates.

A variant without iterative determination of the quantization cell is provided in that a non-uniform quantization of the angle coordinates is carried out instead of taking into account statistical dependencies within the D signal values which are actually to be quantized by means of a linear prediction filter according to FIG. 5 (DPCM). In this connection, the linear statistical links of the D signal values which are actually to be quantized to preceding signal values are made use of by means of conventional DPCM with backward prediction. That is, there is a backward prediction in which an updating of the prediction filter by D steps is carried out after D signal values.

It is suggested that the logarithmic quantization of the amount is maintained so that the signal points can be normalized subsequently in such a way that they lie on a sphere with radius 1. This allows the analytic calculation of the probability density function of the signal points on the spherical surface, e.g., assuming a Gaussian signal process from the autocorrelation function of the source signal or a direct empirical determination of relative occurrences of the signal points on the spherical surface.

A non-uniform cubic quantization of the surface of a sphere with radius 1 can be determined in this way for M>>1, e.g., by means of the optimization formula according to (9). This formula states that, on the average, the amount of every quantization should be equal to the quantization noise. When $\Delta_i$ is the edge length of a (D−1)-dimensional cubic quantization cell and $z_i$ is the associated center point, that is, the reception-side reconstruction vector with amount 1, and $f(v)$; $v:=(\phi_1, \ldots, \phi_{D-1})$ is the probability density function or relative occurrence of signal values on the spherical surface, the following equation should be approximately satisfied:

$$(D-1)\frac{\Delta_i^2}{12} \cdot f(z_i) \cdot \Delta_i^{D-1} = const. \tag{36}$$

with the secondary condition $$\sum_{i=1}^{M\varphi} \Delta_i^{D-1} = \beta_D. \tag{37}$$

This leads directly to a (D−1)-dimensional compressor function $k(v)$ by which the non-uniform quantization of the sphere surface is uniquely determined. The non-uniform quantization can then be completed, for example, as in the one-dimensional case, by a nonlinear deformation of vector v to a vector $z:=k(v)$, subsequent uniform quantization to vector $z_i$ according to III-C, and application of the inverse function $\hat{v}:=k^{-1}(z_i)$ subsequently for obtaining the reconstruction vector.

The resulting (D−1)-dimensional compressor function should preferably be approximated by an analytically describable function or, analogous to the usual representation in one-dimensional compression by means of straight-line segments (e.g., 13-segment characteristic line, see [5]), by (D−2)-dimensional partial planes (with constant partial derivations). When this approximation is latticed orthogonally over the space $$\left(-\frac{\pi}{2}, \frac{\pi}{2}\right]^{D-2} \times (-\pi, \pi]$$

over the D−1 angles, the compressor function can be evaluated in a simple manner.

To simulate spherical logarithmic quantization in combination with DPCM, the quantization of the overture and the aria "Der Vogelfänger bin ich ja" from the opera "Zauberflöte" by Wolfgang Amadeus Mozart was examined (Philips Classics Productions 1994 (DDD), Mozart, "Der Vogelfänger bin ich ja" (Die Zauberflöte), Polygram Records #442569-2, track 3).

Figure 6:
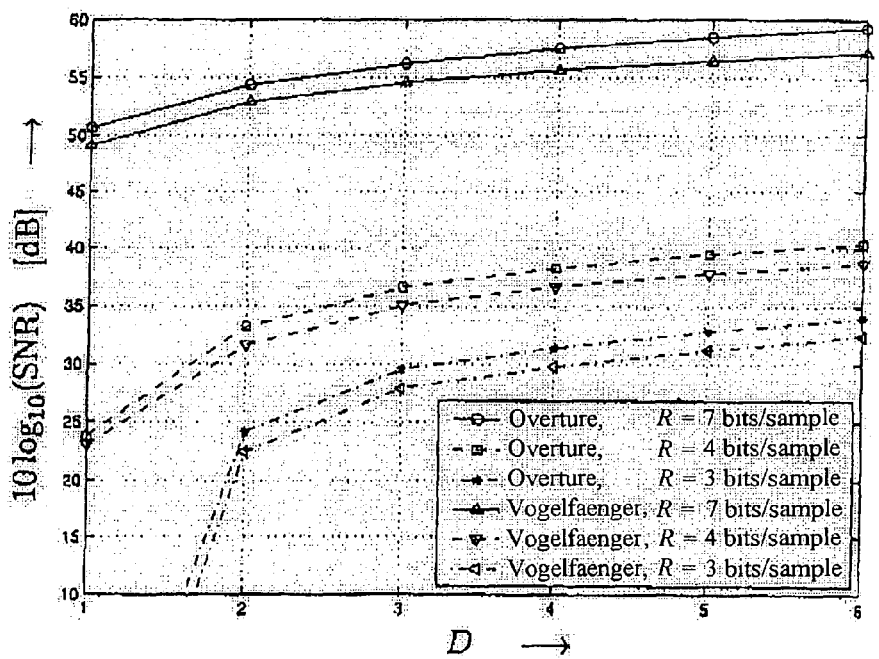
FIG. 6 is a graph illustrating the signal/noise ratio according to another embodiment example of the invention.

FIG. 6 shows simulation results for R=3, R=4 and R=7 bits/sample when A=102726, A=48270, A=4858 and with different dimension numbers D.

The signal was first coded, then decoded and the SNR was calculated by comparison with the original CD signal. The signal/noise ratio is averaged over the entire piece of music. At the low rates, the SNR rises more steeply with D compared to FIG. 3. The reason for this is an improved averaging. The different values of parameter A must be taken into consideration when comparing the results. The aria "Vogelfänger" is stored on audio CD with an average signal level of −32.15 dB and offers an excellent example for audio signal coding because of the signal dynamics and tone colors (prelude, singing, panpipe). These simulation results can be regarded as representative for a large number of audio signals because a universal predictor filter of low order (P=2) was used.

FIG. 6 shows the measured signal/noise ratios averaged over the entire piece of music. It is apparent from a comparison of FIG. 3 (or (1)) and FIG. 6, where D=1, R=7, that the average prediction gain for this simple predictor is about 20 dB to 23 dB (sample frequency: 44.1 kHz!). When R=7, the total gain in all values of D can be favorably approximated by the sum of the two individual gains from spherical logarithmic quantization and DPCM; when R=4, this applies only for D≧5. (Of course, (1) is not applicable, for example, for R=3 or R=4 and D=1, A=48270.)

The average signal level of the overture is around −27.20 dB; this piece of music is characterized by a very large dynamic range from below −70 dB to −17 dB (see also FIG. 7). The segment signal level and the SNRs for the overture example are plotted in FIG. 7. Each segment comprises 6000 samples and therefore corresponds to a time range of 0.136 s. In this case, spherical logarithmic quantization is applied in D=3 dimensions with A=1014 and A=4858 and in D=6 dimensions with A=48270 and with the same compromise predictor of the order of P=2 as in the first example. The top curve shows the large dynamics brought about by the known loud tones divided by pauses over a plurality of bars at the start and in the middle of this popular piece of music. The curves for A=1014 and A=4858 disclose the advantage of an increasing A with respect to the SNR by segment, wherein the pauses should be noted in particular. The bottom curve in FIG. 7 demonstrates this aspect for a further increase in A and the resulting further gain in SNR of 3 dB because of the higher dimension number D=6 (see also FIG. 3). It should be noted that in spite of the low rate of R=4 bits/sample, a $10 \log_{10}$ (SNR)>35 dB (with respect to the original CD) is maintained even in the pauses.

The value A=48270 corresponds to a compression of 12 bits, e.g., for D=1, R=12 a resolution of 24 bits is achieved for small signal values. Of course, there is never a resolution corresponding to 16 bits for D=1, R=4 because the interval number is too low. However, when spherical logarithmic quantization is applied in 6 dimensions, the extremely large value of A=48270 is actually well chosen for a high minimum value of the SNR. In this case, the resolution is even identical to that of the original CD data for segments with a signal level of −70 dB and lower. To date, no one has been found, even among trained personnel, who was capable of reliably hearing a difference between the quantized signal at R=4, D=6, A=48270 and the original signal.

The preceding description shows a waveform-preserving digitization method for analog source signals which, on the one hand, combines the gain by multidimensional quantization with the advantages of logarithmic quantization and, on the other hand, is capable of additionally increasing the objective signal/noise ratio through the addition of prediction gains. In conclusion, it is noted that, in addition to a favorable exchange of rate and distortion, this method is distinguished above all by an extremely large dynamic range accompanied at the same time by an extremely low system-induced delay of the signal by only a few sample intervals.

While the foregoing description and drawings represent the present invention, it will be obvious to those skilled in the art that various changes may be made therein without departing from the true spirit and scope of the present invention.

The invention claimed is:

1. A method for processing digital source signals comprising the following steps: digitizing analog source signals; transforming the digitized source signals from the time domain to a spherical domain, wherein the transformation is a D-dimensional transformation with D>2; and logarithmic quantizing the radius in the spherical domain.

2. The method according to claim 1, wherein a transformation of the source signals into spherical coordinates is carried out.

3. The method according to claim 2, wherein a logarithmic quantization of the amount is carried out in spherical coordinates.

4. The method according to claim 2, wherein a non-uniform quantization of the angle coordinates of the spherical coordinates is carried out.

5. The method according to claim 1, comprising the steps of quantizing the analog source signals in polar coordinates, wherein the amount of the source signals in polar coordinates is logarithmically quantized, and wherein the quantization of the angle in polar coordinates of the analog source signals is carried out depending on the quantized angle of higher order.

6. The method according to claim 5, wherein the quantization of a D-dimensional sphere with a unit radius is carried out by a network of D−1-dimensional cubes.

7. The method according to claim 5, wherein those quantization cells which lie on the surface of a sphere with unit radius are selected, wherein the quantization cells are D−1-dimensional cubes.

8. The method for the compression of analog signals, comprising the steps of carrying out a digitization of analog source signals by a method according to claim 1, and carrying out a differential pulse code modulation.

9. The method according to claim 8, comprising the steps of carrying out a forward prediction for determining a starting value for samples of the quantization based on the current state of a predictor filter, reconstructing the subsequent D samples, carrying out a D-dimensional logarithmic spherical quantization of the values obtained by the forward prediction in order to determine a starting cell, iterative run-through of the prediction of the differential pulse code modulation in order to determine a quantization cell with the smallest quantization error.

10. The method according to claim 8, wherein a lattice decoding is carried out for determining a favorable quantization cell.

11. The method according to claim 8, wherein a backward prediction of a differential pulse code modulation is carried out, wherein an updating of the prediction filter by D steps is carried out after processing D samples.

12. An apparatus for processing digital source signals comprising: means for the digitization of analog source signals; means for the transformation of the digitized source signals from the time domain to a spherical domain, wherein the transformation is a D-dimensional transformation with D>2; and means for the logarithmic quantization of the radius in the spherical domain.

13. Apparatus according to claim 12, with a transformation device for carrying out a transformation of the analog source signals in spherical coordinates.

14. Apparatus according to claim 12, wherein a logarithmic quantization of the amount is carried out.

15. Apparatus according to claim 13, wherein a non-uniform quantization of the angle coordinates of the spherical coordinates is carried out.

16. The apparatus of claim 12, wherein the apparatus further comprises:
an apparatus for the compression of analog signals and an encoder for differential pulse code modulation.

17. Apparatus according to claim 16, with a forward prediction device for determining a starting value for the samples of the quantization based on the current state of a predictor filter, a reconstruction device for reconstructing the subsequent D samples, a D-dimensional logarithmic spherical quantization device for quantizing the values obtained by the forward prediction in order to determine a starting cell, wherein the prediction of the differential pulse code modulation is run through iteratively in order to determine a quantization cell with the smallest quantization error.

18. Apparatus according to claim 17, wherein a lattice decoding device is carried out for determining a favorable quantization cell.

19. Apparatus according to claim 17, wherein a backward prediction of a differential pulse code modulation is carried out, wherein the prediction filter is updated by D steps after processing D samples.

* * * * *